US008138000B2

(12) United States Patent
Keller et al.

(10) Patent No.: US 8,138,000 B2
(45) Date of Patent: Mar. 20, 2012

(54) METHODS FOR FORMING SEMICONDUCTOR LIGHT EMITTING DEVICES AND SUBMOUNTS

(75) Inventors: Bernd Keller, Goleta, CA (US); James Ibbetson, Goleta, CA (US); Peter Andrews, Durham, NC (US); Gerald H. Negley, Carrboro, NC (US); Norbert Hiller, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 71 days.

(21) Appl. No.: 12/397,555

(22) Filed: Mar. 4, 2009

(65) Prior Publication Data
US 2009/0159918 A1    Jun. 25, 2009

Related U.S. Application Data

(63) Continuation of application No. 10/987,894, filed on Nov. 12, 2004, now Pat. No. 7,518,158.

(60) Provisional application No. 60/528,054, filed on Dec. 9, 2003.

(51) Int. Cl.
*H01L 21/00* (2006.01)

(52) U.S. Cl. ........... 438/26; 438/27; 438/28; 257/95; 257/98; 257/E33.061

(58) Field of Classification Search ............ 438/26, 438/27, 28, 29; 257/E33.059, E33.061, 95, 257/98; 313/501, 502, 503
See application file for complete search history.

(56) References Cited

U.S. PATENT DOCUMENTS

| 4,918,497 A | 4/1990 | Edmond ............... 357/17 |
| 4,966,862 A | 10/1990 | Edmond ............... 437/100 |
| 5,003,357 A | 3/1991 | Kim et al. |
| 5,027,168 A | 6/1991 | Edmond ............... 357/17 |
| 5,210,051 A | 5/1993 | Carter, Jr. ............ 437/107 |
| 5,338,944 A | 8/1994 | Edmond et al. ........ 257/76 |
| 5,393,993 A | 2/1995 | Edmond et al. ........ 257/77 |
| 5,416,342 A | 5/1995 | Edmond et al. ........ 257/76 |
| 5,523,589 A | 6/1996 | Edmond et al. ........ 257/77 |
| 5,604,135 A | 2/1997 | Edmond et al. ........ 437/22 |
| 5,631,190 A | 5/1997 | Negley ............... 438/33 |

(Continued)

FOREIGN PATENT DOCUMENTS
DE    297 24 543    2/2002
(Continued)

OTHER PUBLICATIONS

International Search Report and Written Opinion of the International Searching Authority for PCT application No. PCT/US2004/039619 mailed on Dec. 5, 2005.

(Continued)

*Primary Examiner* — Julio J Maldonado
(74) *Attorney, Agent, or Firm* — Myers Bigel Sibley & Sajovec (57) ABSTRACT

A submount for a semiconductor light emitting device includes a semiconductor substrate having a cavity therein configured to receive the light emitting device. A first bond pad is positioned in the cavity to couple to a first node of a light emitting device received in the cavity. A second bond pad is positioned in the cavity to couple to a second node of a light emitting device positioned therein. Light emitting devices including a solid wavelength conversion member and methods for forming the same are also provided.

24 Claims, 4 Drawing Sheets

U.S. PATENT DOCUMENTS

| | | | | |
|---|---|---|---|---|
| 5,739,554 | A | 4/1998 | Edmond et al. | 257/103 |
| 5,912,477 | A | 6/1999 | Negley | 257/95 |
| 6,120,600 | A | 9/2000 | Edmond et al. | 117/89 |
| 6,187,606 | B1 | 2/2001 | Edmond et al. | 438/46 |
| 6,201,262 | B1 | 3/2001 | Edmond et al. | 257/77 |
| 6,329,696 | B1 | 12/2001 | Tanaka | |
| 6,531,328 | B1 * | 3/2003 | Chen | 438/26 |
| 6,635,363 | B1 | 10/2003 | Duclos et al. | 428/690 |
| 6,642,550 | B1 * | 11/2003 | Whitworth et al. | 257/99 |
| 6,747,406 | B1 | 6/2004 | Bortscheller et al. | 313/512 |
| 6,791,116 | B2 * | 9/2004 | Bhat et al. | 257/79 |
| 6,853,010 | B2 | 2/2005 | Slater, Jr. et al. | 257/98 |
| 6,858,456 | B2 * | 2/2005 | Noguchi et al. | 438/26 |
| 6,876,008 | B2 * | 4/2005 | Bhat et al. | 257/99 |
| 6,936,857 | B2 * | 8/2005 | Doxsee et al. | 257/89 |
| 2002/0063520 | A1 | 5/2002 | Yu et al. | |
| 2002/0084749 | A1 * | 7/2002 | Ayala et al. | 313/512 |
| 2002/0123164 | A1 | 9/2002 | Slater, Jr. et al. | 438/39 |
| 2003/0006418 | A1 | 1/2003 | Emerson et al. | 257/79 |
| 2003/0102473 | A1 * | 6/2003 | Chason et al. | 257/43 |
| 2004/0041222 | A1 | 3/2004 | Loh | 257/433 |
| 2004/0090161 | A1 * | 5/2004 | Noguchi et al. | 313/152 |
| 2005/0280019 | A1 * | 12/2005 | Konno | 257/100 |

FOREIGN PATENT DOCUMENTS

| | | |
|---|---|---|
| EP | 1 220 332 | 7/2002 |
| EP | 1 249 874 | 10/2002 |
| JP | 10074986 | 3/1997 |
| JP | 11004023 | 1/1999 |
| JP | 11-251644 | 9/1999 |
| JP | 11-307818 | 11/1999 |
| JP | 2002203989 | 7/2002 |
| JP | 2002-220350 | 8/2002 |
| JP | 2002232017 | 8/2002 |
| JP | 2003347601 | 12/2003 |

OTHER PUBLICATIONS

Translation of Chinese Office Action dated Nov. 30, 2007 for corresponding Patent Application No. 200480036254.3.

Malaysian Office Action dated Jun. 13, 2008 for corresponding Patent Application No. PI20045094.

* cited by examiner

METHODS FOR FORMING SEMICONDUCTOR LIGHT EMITTING DEVICES AND SUBMOUNTS

RELATED APPLICATIONS

This application is a continuation of application Ser. No. 10/987,894 filed Nov. 12, 2004 now U.S. Pat. No. 7,518,158 which claims the benefit of and priority to U.S. Provisional Patent Application No. 60/528,054, entitled "LED Package Including Recessed Submount," filed Dec. 9, 2003, the disclosures of which are hereby incorporated herein by reference as if set forth in their entirety.

BACKGROUND OF THE INVENTION

This invention relates to semiconductor light emitting devices and fabricating methods therefore, and more particularly to packaging and packaging methods for semiconductor light emitting devices.

Semiconductor light emitting devices are known for use in a variety of light source applications. For example, light emitting diodes (or LEDs) are well known solid state electronic devices capable of generating light upon application of a sufficient voltage. Light emitting diodes generally comprise a p-n junction formed in an epitaxial layer deposited on a substrate, such as sapphire, silicon, silicon carbide, gallium arsenide and the like. The wavelength distribution of the light generated by the LED generally depends on the material from which the p-n junction is fabricated and the structure of the thin epitaxial layers that comprise the light generation region of the device.

Commonly, an LED includes an n-type substrate, an n-type epitaxial region formed on the n-type substrate and a p-type epitaxial region formed on the n-type epitaxial region. In order to facilitate the application of a voltage to the device, an anode ohmic contact may be formed on a p-type region of the device (typically, an exposed p-type epitaxial layer) and a cathode ohmic contact may be formed on an n-type region of the device (such as the substrate or an exposed n-type epitaxial layer). The ohmic contacts, thus, may provide contact nodes for connecting the LED to an electronic circuit.

Figure 1:
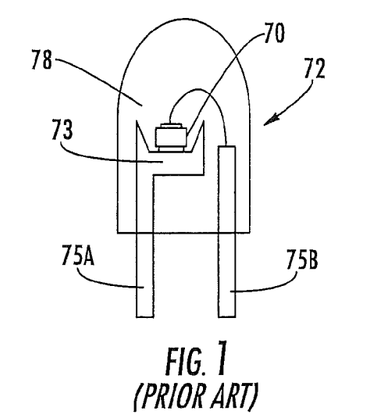
FIG. 1 is a schematic cross-sectional side view of a conventional light emitting device package.

As illustrated in FIG. 1, a conventional LED 70 may be packaged in a standard package 72 that may include a conductive/reflective mounting cup 73 that, in turn, may be connected to a cathode/anode lead 75A. The LED chip 70 is typically mounted in the cup with a silver epoxy. The anode/cathode of the LED chip 70 may be wirebonded to an anode/cathode lead 75B. The entire package may then be encapsulated in, for example, a transparent epoxy 78. For white-emitting LED chips, the encapsulant 78 may include a wavelength converter material, such as a wavelength-converting phosphor. In a typical white LED application, some of a blue light emitted from the chip 70 stimulates the wavelength conversion material to emit longer wavelength light, such as yellow light. The "unconverted" blue light from the chip combines with the longer wavelength light emitted from the phosphor to synthesize white light, which may be emitted from the package.

Flip-chip mounting of LEDs involves mounting the LED onto the submount substrate side up. Light may then be extracted and emitted through the transparent substrate. Flip chip mounting may be a desirable technique for mounting SiC-based LEDs. Because SiC generally has a higher index of refraction than GaN, light generated in the light emitting region may not internally reflect (i.e. reflect back into the GaN-based layers) at the GaN/SiC interface. Flip chip mounting of SiC-based LEDs may offer improved light extraction when employing certain chip-shaping techniques known in the art. Flip chip packaging of SiC LEDs may have other benefits as well, such as improved heat extraction/dissipation, which may be desirable depending on the particular application for the chip.

Some problems commonly encountered with conventional white LED packages relate to uniformity of emission and the size of the optical image generated by the package. Conventional packages tend to have a large optical image size, which is typically a function of the size of the metallic mounting cup. Moreover, because the wavelength conversion material may be distributed over a large area compared to the size of the LED chip and because the exact distribution of wavelength conversion material within the coating may be difficult to control, the uniformity and reproducibility of the light output may suffer.

SUMMARY OF THE INVENTION

Embodiments of the present invention provide methods of packaging a semiconductor light emitting device. The light emitting device is disposed in a cavity of a submount. A solid wavelength conversion member is positioned on the submount over the light emitting device to receive and wavelength convert light emitted from the light emitting device. The solid wavelength conversion member may be a rigid wavelength conversion member of glass, silicon and/or cured epoxy having wavelength conversion material therein. The wavelength conversion material may be phosphor. The wavelength conversion member may be flat and/or concave on a surface thereof opposite the light emitting device. Positioning the wavelength conversion member on the submount may be preceded by testing the wavelength conversion member to determine a wavelength conversion characteristic thereof.

In other embodiments of the present invention, a submount for a semiconductor light emitting device includes a semiconductor substrate having a cavity therein configured to receive the light emitting device. A first bond pad in the cavity is positioned to couple to a first node of a light emitting device received in the cavity. A second bond pad in the cavity is positioned to couple to a second node of a light emitting device positioned therein. The cavity may include a floor and a sidewall angled with respect to the floor at an angle of at least about 90°. The first and second bond pad may be positioned on the floor of the cavity.

In further embodiments of the present invention, the cavity has a height from the floor to a top surface of the semiconductor substrate of at least a height of the light emitting device to be received therein. A receiving recess may be provided in a top surface of the semiconductor substrate adjacent the cavity. The recess may be configured to receive a solid wavelength conversion element and position the wavelength conversion element over the cavity to receive light emitting from a light emitting device in the cavity. A reflective material coating may be provided on the floor and/or sidewall of the cavity.

In other embodiments of the present invention, the semiconductor substrate includes a first conductive path extending through the substrate from the first bond pad to an external surface of the semiconductor substrate. A second conductive path extends through the substrate from the second bond pad to the external surface of the substrate. Both the first and second conductive path may extend to an underside of the external surface of the semiconductor substrate. A first external mounting pad and a second external mounting pad may be positioned on the external surface of the semiconductor substrate. The first conductive path may extend to the first external mounting pad and the second conductive path may extend to the second external mounting pad.

In further embodiments of the present invention, integral opposing zener diode junctions couple the first and second conductive paths to provide electro-static discharge (ESD) protection to a light emitting device mounted in the cavity. The opposing zener diode junctions may include first conductivity type doped regions of semiconductor material forming at least a portion of the first conductive path and at least a portion of the second conductive path and an opposite conductivity type doped region of semiconductor material positioned therebetween. The first conductivity type may be an n-type and the opposite conductivity type may be a p-type. The n-type doped regions may be in contact with respective ones of the first and second bond pads or the first and second external mounting pads. The semiconductor substrate may be a p-type substrate and the n-type doped regions may be wells of n-type dopants in the p-type substrate. The first and second conductive paths may further include respective metal filled via portions extending from respective first type doped regions.

In other embodiments of the present invention, a light emitting device package including a submount as described above further includes an encapsulant material in the cavity between the light emitting device and the wavelength conversion member. The encapsulant material may have a refractive index of at least about 1.5.

In further embodiments of the present invention, light emitting device packages include a semiconductor substrate having a cavity therein. The cavity may have a floor and a sidewall angled with respect to the floor at an angle of at least about 90°. A first bond pad in the cavity is positioned to couple to a first node of a light emitting device received in the cavity and a second bond pad in the cavity is positioned to couple to a second node of a light emitting device positioned therein. A first conductive path extends through the substrate from the first bond pad to an external surface of the semiconductor substrate and a second conductive path extends through the substrate from the second bond pad to the external surface of the substrate. A light emitting device is received in the cavity and has nodes coupled to the first and second bond pads. Integral opposing zener diode junctions couple the first and second conductive paths to provide electro-static discharge (ESD) protection for the light emitting device. A solid wavelength conversion member is positioned on a top surface of the semiconductor substrate over the light emitting device to receive and wavelength convert light emitted from the light emitting device.

In other embodiments of the present invention methods of forming a submount for a semiconductor light emitting device include forming a cavity in a semiconductor substrate configured to receive a light emitting device. The cavity has a floor and a sidewall angled with respect to the floor at an angle of at least about 90°. A first conductive path is formed extending from the cavity to an external surface of the substrate and a second conductive path is formed extending from the cavity to an external surface of the substrate. A first bond pad is formed in the cavity on an end of the first conductive path formed therein and a second bond pad is formed in the cavity on an end of the second conductive path formed therein.

In further embodiments of the present invention, a light emitting device package is formed using a submount by positioning the light emitting device in the cavity with a first node of the light emitting device coupled to the first bond pad and a second node of the light emitting device coupled to the second bond pad. A solid wavelength conversion member is positioned on the substrate over the light emitting device to receive and wavelength convert light emitted from the light emitting device. The solid wavelength conversion member may be tested prior to positioning on the substrate to determine a wavelength conversion characteristic thereof.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" or "coupled to" another element, it can be directly on or coupled to the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. The term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

As will also be appreciated by those of skill in the art, while the present invention is described with respect to semiconductor wafers and diced chips, such chips may be diced into arbitrary sizes. Accordingly, the present invention is not limited to the relative size and spacing illustrated in the accompanying figures. In addition, certain features of the drawings are illustrated in exaggerated dimensions for clarity of drawing and ease of explanation.

As used herein, the term "semiconductor light emitting device" may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green light emitting diodes ("LEDs") may be provided.

Some embodiments of the present invention now will be described, generally with reference to gallium nitride-based light emitting diodes on silicon carbide-based substrates for ease of understanding the description herein. However, it will be understood by those having skill in the art that other embodiments of the present invention may be based on a variety of different combinations of substrate and epitaxial layers. For example, combinations can include AlGaInP diodes on GaP substrates; InGaAs diodes on GaAs substrates; AlGaAs diodes on GaAs substrates; SiC diode on SiC or sapphire ($Al_2O_3$) substrate and/or a nitride-based diode on gallium nitride, silicon carbide, aluminum nitride, sapphire, zinc oxide and/or other substrates.

Thus, for example, the semiconductor light emitting device may be a gallium nitride-based LED or laser fabricated on a silicon carbide substrate, such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. application Ser. No. 10/659,241, entitled Phosphor-Coated Light Emitting Diodes Including Tapered Sidewalls and Fabrication Methods Therefor, filed Sep. 9, 2003, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

In some embodiments of the present invention, a package for mounting a light emitting diode (LED) chip includes a semiconductor submount including therein a cavity for receiving an LED chip. The cavity may include a floor and a sidewall angled with respect to the floor at an angle of at least 90°. The package may further include at least anode and cathode bond pads on the floor of the cavity for attaching anode and cathode contacts of an LED. The depth of the cavity may be slightly larger than the height of the LED chip to be mounted therein. Conductive via connections may extend through the substrate and electrically connect the anode and cathode bond pads to respective external mounting pads, which may be mounted on one or more external sidewalls of the submount. In particular, such conductive via connections may be used where the package is insulating and/or semi-insulating in nature. In some embodiments, the external mounting pads are formed on the underside of the submount. The floor and sidewall surfaces of the cavity may be coated with a reflective material, such as silver, to increase reflectivity.

In some embodiments of the present invention, an optically clear encapsulant may surround and protect the mounted LED chip within the cavity. The encapsulant may have a refractive index of about 1.5 or greater, which may reduce reflection at the chip/encapsulant boundary to improve light extraction. External mounting pads may be formed on external surfaces of the submount by plating or other methods.

A rigid wavelength conversion element in some embodiments may be glass, silicone, epoxy or any other optically clear material with immersed wavelength conversion material and may surmount the LED chip and cover the cavity so that light escaping from the cavity passes through the wavelength conversion element and interacts with wavelength conversion material therein to produce wavelength-converted light emission. The rigid wavelength conversion element may be flat, curved, or may be shaped to form a thin lens having a predetermined optical transmission pattern. For example, the wavelength conversion element may have an optical transmission pattern that is matched to the optical emission pattern of a particular LED chip shape.

In some embodiments of the present invention, the submount includes first and second heavily doped n-type regions and a heavily doped p-type region forming zener junctions with each of said first and second n-type regions. The anode bond pad may be in electrical contact with the first n-type region while the cathode contact may be in contact with the second n-type region. Thus, the anode and cathode leads to the LED chip may be connected by a pair of opposing zener diode junctions, which may provide electrostatic discharge (ESD) protection to the mounted LED chip. In some embodiments, the first and second heavily doped n-type regions in the submount are fabricated by implantation or diffusion of wells of n-type dopants into a p-type substrate. Metal-plated or metal-filled vias may connect the wells to the opposite surface of the submount for external connection.

Embodiments of the present invention will now be further described with reference to the various embodiments illustrated in FIGS. 2-7. More particularly, some embodiments of light emitting device packages and submounts for the same are illustrated in FIGS. 2-5.

By way of background, in conventional "glob top" white solid state emitters (i.e. devices in which the wavelength conversion material is applied as a glob of epoxy over top a conventionally mounted LED chip) the size of the white image produced by the packaged device is defined by the optical cavity of the package reflector that confines the converter. Some embodiments of the present invention allow placement of the white converter closer to the chip, possibly reducing its image size. This may be enabled by the via electrode connectors to the outside electrode pads, which may eliminate the need for conventional wire bonds and wire bond pads inside the optical cavity. Moreover, the white converter can be formed at the chip level, which may provide a flexible white emitter package that may be employed in various package platforms.

Compared to existing coated white chip solutions, some embodiments of the present invention may provide benefits from allowing use of pre-manufactured white converters that can be pre-screened to ensure that they provide the correct color point prior to being combined with a relatively high-cost LED chip. A pre-manufactured wavelength conversion member may also, for example, be matched to a particular light emitting device output (such as frequency or the like determined by pre-testing the particular light emitting device) and desired output of the packaged light emitting device. The result may be a chip package that may provide a reproducible and controlled white or other light emission at lower cost and improved yields.

Figure 2:
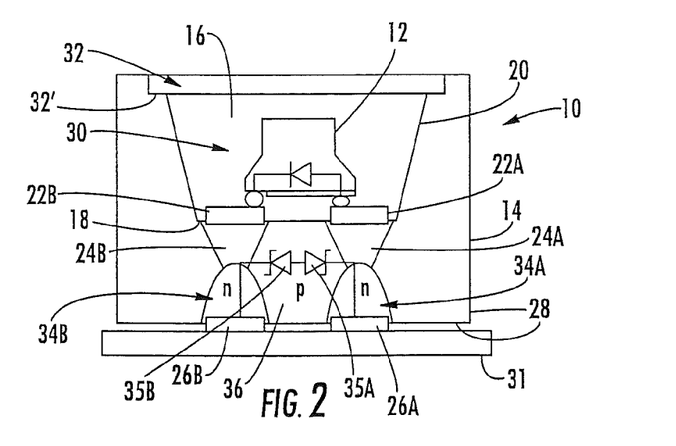
FIG. 2 is a schematic cross-sectional side view of a light emitting device package according to some embodiments of the invention.

Referring now to the cross-sectional view of FIG. 2, a semiconductor light emitting device package including a submount according to some embodiments of the present invention will now be described. As shown in FIG. 2, a package 10 is provided for mounting a light emitting diode (LED) chip 12. The package 10 in the embodiments illustrated in FIG. 2 includes a semiconductor submount/substrate 14 having a cavity 16 therein configured to receive a light emitting device such as the LED chip 12. The cavity 16 may include a floor 18 and a sidewall 20. The sidewall 20 may be angled with respect to the floor at an angle of at least about 90°. The cavity 16 may also have a height (depth) from the floor 18 to a top surface of the semiconductor substrate 14 of at least a height, for example, slightly larger than, a height of the LED chip 12 or other light emitting device to be mounted therein.

For the embodiments illustrate in FIG. 2, the package 10 also includes an anode bond pad 22A and a cathode bond pad 22B positioned on the floor 18 of the cavity 16 for attaching anode and cathode contact nodes of the LED 12 or other light emitting device therein. By using bond pads 22A, 22B in accordance with some embodiments of the present invention, a submount hybrid may be manufactured without the need for wirebonds, which may reduce the chip and/or package size.

In some embodiments, the semiconductor submount/substrate 14 is silicon. The cavity 16 may be formed in the silicon submount by etching and/or other suitable means. Silicon processing methods, including photolithography of silicon wafers to produce recesses such as cavity 16, diffusion and implantation of dopants, formation of zener diode junctions and formation of conductive vias therein, are known in the semiconductor art and will not be further described herein except as regards aspects particular to the present invention. While the description of embodiments herein will be generally presented with reference to silicon, other semiconductor materials may be used for the submount/substrate 14.

Conductive paths, including via connections 24A, 24B and doped regions 34A, 34B, extend through or into the submount/substrate 14 and electrically connect the anode 24A and cathode 24B bond pads to respective external mounting pads 26A, 26B in some embodiments of the present invention. The external mounting pads 26A, 26B may be mounted on one or more walls defining an external surface 28 of the submount/substrate 14. The electrical vias may be formed by implantation, diffusion and/or as metallic vias by plating or similar methods. Metallic vias may have the added advantage of reducing the resistance for the heat dissipation to a circuit board or heat sink assembly. In some embodiments of the present invention, the external mounting pads 26A, 26B are formed on the underside of the external surface 28 of the submount/substrate 14. The external mounting pads 26A, 26B may be formed on external surfaces of the submount, for example, by plating or other methods.

The floor 18 and sidewall 20 surfaces of the cavity 16 may be coated with a reflective material, such as silver, to increase reflectivity of the cavity 16. An optically clear encapsulant 30 may surround and/or protect the mounted light emitting device, such as LED chip 12 within the cavity 16. In some embodiments of the present invention, to reduce reflection at the chip/encapsulant boundary to improve light extraction, the encapsulant 30 may have a refractive index of about 1.5 or greater.

A wavelength conversion element 32 is positioned on a top surface of the submount/substrate 14 over the light emitting device/LED chip 12. The wavelength conversion element 32 may be positioned in a recess 32' in the top surface of the semiconductor submount/substrate 14 adjacent the cavity 16. The wavelength conversion element 32 may be one or more of glass, silicone, cured epoxy and/or other optically clear material with immersed wavelength conversion material, such as a phosphor. The wavelength conversion element 32 may cover the cavity 16 so that light escaping from the cavity 16 passes through the wavelength conversion element 32 and interacts with wavelength conversion material therein to produce a wavelength-converted light emission such as, for example, synthesized white light.

Figure 3A:
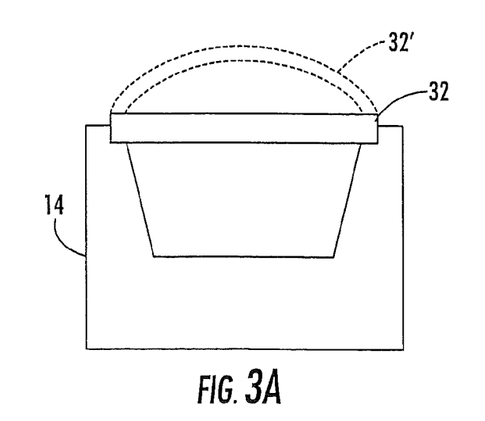
FIGS. 3A and 3B are schematic cross sectional side views showing a wavelength conversion element according to some embodiments of the present invention.
Figure 3B:
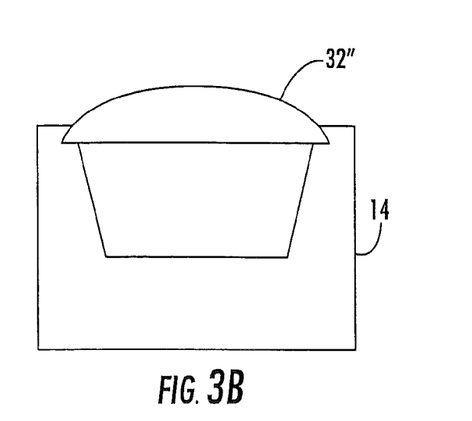

In some embodiments of the present invention, the wavelength conversion element 32 is a solid member. In particular, the wavelength conversion element 32, 32', 32" in such embodiments may be a rigid, semi-rigid or flexible solid member. As illustrated in FIGS. 3A and 3B, the wavelength conversion element 32, 32', 32" may have a flat cross section 32, or a curved shape 32' may be shaped to form a thin lens having a predetermined optical transmission pattern 32". For example, the wavelength conversion element may have an optical transmission pattern that is matched to the optical emission pattern of a particular LED chip shape, or that is shaped to form a predetermined near- or far-field optical pattern. The wavelength conversion element may be flat 32 (FIG. 3A) curved 32' (FIG. 3A) and/or convex 32" (FIG. 3B) and/or concave on an upper and/or a lower surface thereof opposite the light emitting device 12. The wavelength conversion element may also include a phosphor film, which may be deposited or otherwise embedded into the encapsulant.

The wavelength conversion element 32 in some embodiments of the present invention may be pre-fabricated, separate from the submount, using, for example, low cost, large area manufacturing techniques such as screen printing, ink jet printing and/or uniform molding and cutting. In addition, the wavelength conversion element 32 may be molded and tested individually or in bulk sheets for improved uniformity of light emission before positioning on the submount/substrate 14. Pre-manufacturing and/or testing of the wavelength conversion element 32 may provide advantages in yield and the like, particularly for manufacturing wavelength conversion elements that include multiple phosphors.

Returning again to FIG. 2, in some embodiments of the present invention, the submount/substrate 14 may include the first and second heavily doped n-type regions 34A, 34B. A heavily doped p-type region 36 may form schematically illustrated zener junctions 35A, 35B with the first and second n-type regions 34A, 34B. Depending on its fabrication method, the junctions may be formed horizontally or vertically. The anode bond 22A pad may be in electrical contact with the first n-type region 34A while the cathode bond pad 22B may be in electrical contact with the second n-type region 34B. Thus, the anode and cathode lead nodes of a light emitting device 12 in the cavity 16 may be connected by a pair of opposing zener diode junctions (indicated schematically in FIG. 2) that together may provide electrostatic discharge (ESD) protection to the mounted light emitting device/LED chip 12. As further shown in FIG. 2, the package 10 may be mounted on a substrate 31 by, for example, conventional methods. The substrate 31 may be, for example, a printed circuit board or metal core printed circuit board, which may provide improved heat dissipation.

Figure 4:
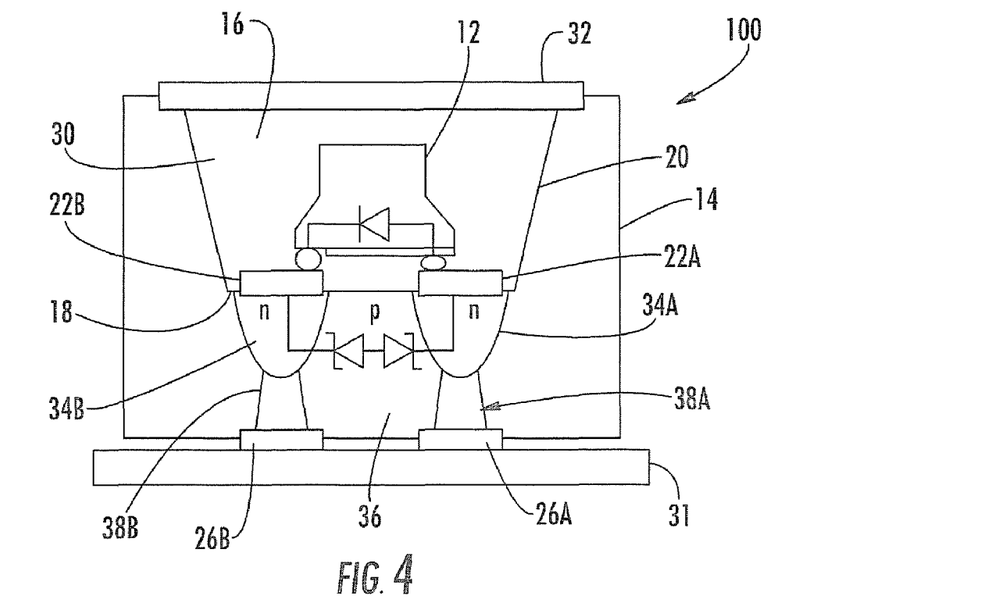
FIGS. 4 and 5 are schematic cross-sectional side views of light emitting device packages according to other embodiments of the present invention.

Further embodiments of the present invention will now be described with reference to FIG. 4. As illustrated in FIG. 4, first and second heavily doped n-type regions 34A, 34B in the submount/substrate 14 of a package 100 may be fabricated, for example, by implantation or diffusion of wells of n-type dopants into a p-type substrate. Metal-plated vias 38A, 38B may connect the wells to the opposite surface of the submount/substrate 14 to complete first and second conductive paths to an external surface of the submount/substrate 14 for external connection. This may also reduce the thermal resistance between the LED and the heat dissipation element (heat sink, metal core PCB, etc.).

The bond pads 22A, 22B and mounting pads 26A, 26B should generally be in direct electrical contact with the n-type regions 34A, 34B, respectively, and not the p-type region 36 (or with each other), otherwise short-circuiting of the anode and cathode connecting nodes of the LED chip 12 or the embedded zener diode junctions 35A, 35B may result. Accordingly, for example, an insulation region may be positioned between a pad 26A, 26B and the p-type region of the semiconductor substrate or the pad 26A, 26B can be limited in size so as not to overlap the p-type region. In some embodiments of the present invention, such as where no electro-static discharge (ESD) functionality is required, the submount may be fabricated from insulating material, such as semi-insulating semiconductors, ceramic or similar material.

Figure 5:
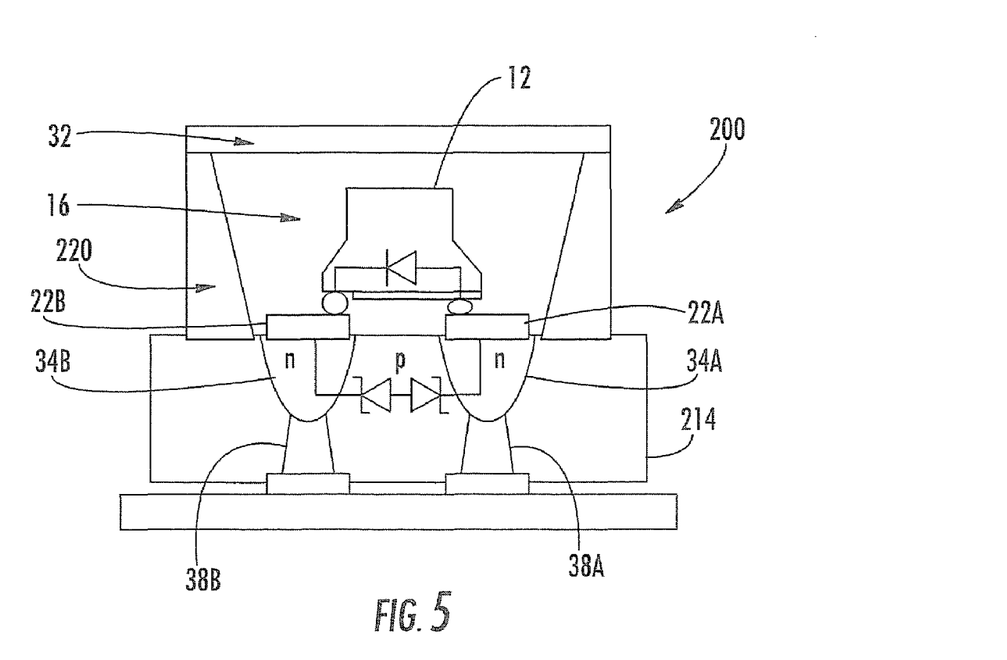

Further embodiments of the present invention will now be described with reference to FIG. 5. As illustrated in the embodiments of the present invention shown in FIG. 5 the package 200 may include a planar substrate 214 on which a light funnel 220 is mounted. Light funnel 220 may be a reflecting solid material or a transparent material having a refractive index less than the refractive index of an encapsulant 16 positioned therein so that light incident on the light funnel 220 may be internally reflected towards the wavelength conversion element 32 positioned over the cavity 16 defined by the light funnel 220.

Embodiments of the present invention may be suitable for providing, for example, saturated color and/or white LED packages. In particular, some embodiments of the present invention may be used for chip-on-board assemblies that utilize a white-light emitting package having a small footprint and for other white light applications in which a small emitter size is desirable (for example for coupling into waveguides or for small pixel displays). As described above, some embodiments of the present invention may provide for packaging of a semiconductor light emitting device in a cavity of a submount with a solid wavelength conversion member positioned on the submount over the light emitting device to receive and wavelength convert light emitted from the device.

While the present invention was described above with reference to embodiments including zener diode junctions formed by n-type doped regions in a p-type doped substrate, it will be understood that p-type doped regions may be provided in an n-type doped substrate in other embodiments of the present invention. Further embodiments of the present invention need not include zener diode junctions in the substrate and electrical connection to an external circuit may be provided by other means, such as by conductive vias formed through the substrate 14.

Figure 6:
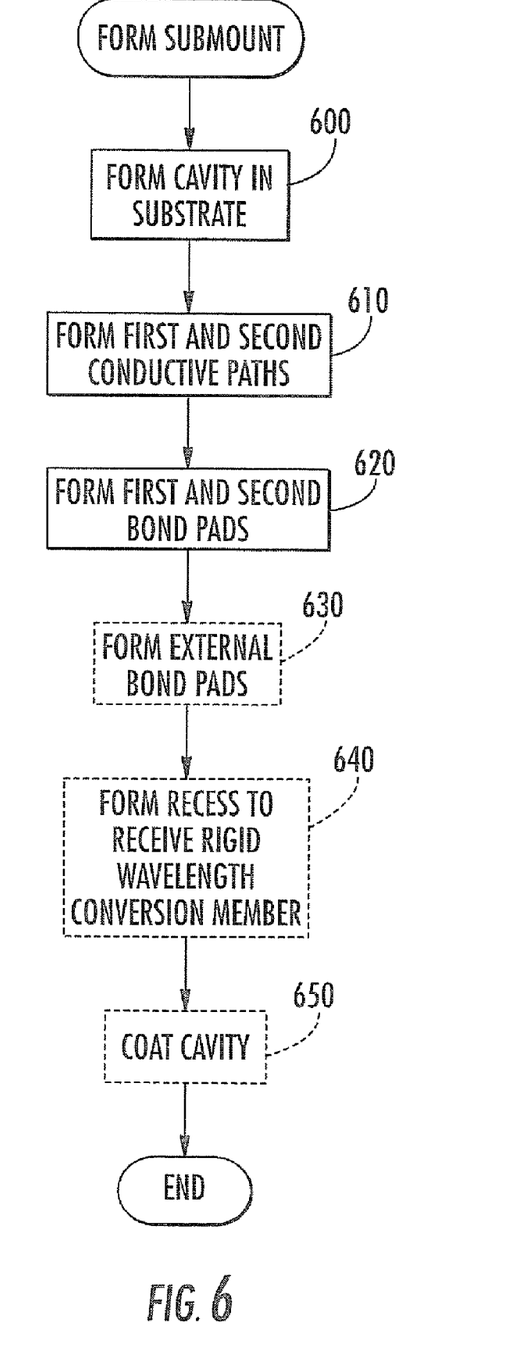
FIG. 6 is a flowchart illustrating operations for forming a submount for a semiconductor light emitting device according to some embodiments of the present invention.

Particular embodiments of methods for forming a submount for a semiconductor light emitting device using a semiconductor substrate will now be further described with reference to the flow chart illustration of FIG. 6. As shown in FIG. 6, operations begin at Block 600 by forming a cavity in a semiconductor substrate configured to receive a light emitting device. The cavity may have a floor and a sidewall and the sidewall may be angled with respect to the floor at an angle of at least about 90°. First and second conductive paths are formed in the substrate extending from the cavity to an external surface of the substrate (Block 610). A first bond pad is formed in the cavity on an end of the first conductive path and a second bond pad is formed in the cavity on an end of the second conductive path (Block 620).

Additional operations may be performed according to particular embodiments of the present invention as will now be further described with reference to FIG. 6. External bond pads may be formed at ends of the respective conductive paths on an external surface of the substrate (Block 630). In addition, a recess may be formed on a top surface of the semiconductor substrate configured to receive a rigid wavelength conversion member (Block 640). In some embodiments of the present invention, an inner surface of the cavity, including a floor and/or sidewalls of the cavity, is coated with a reflective material (Block 650).

Figure 7:
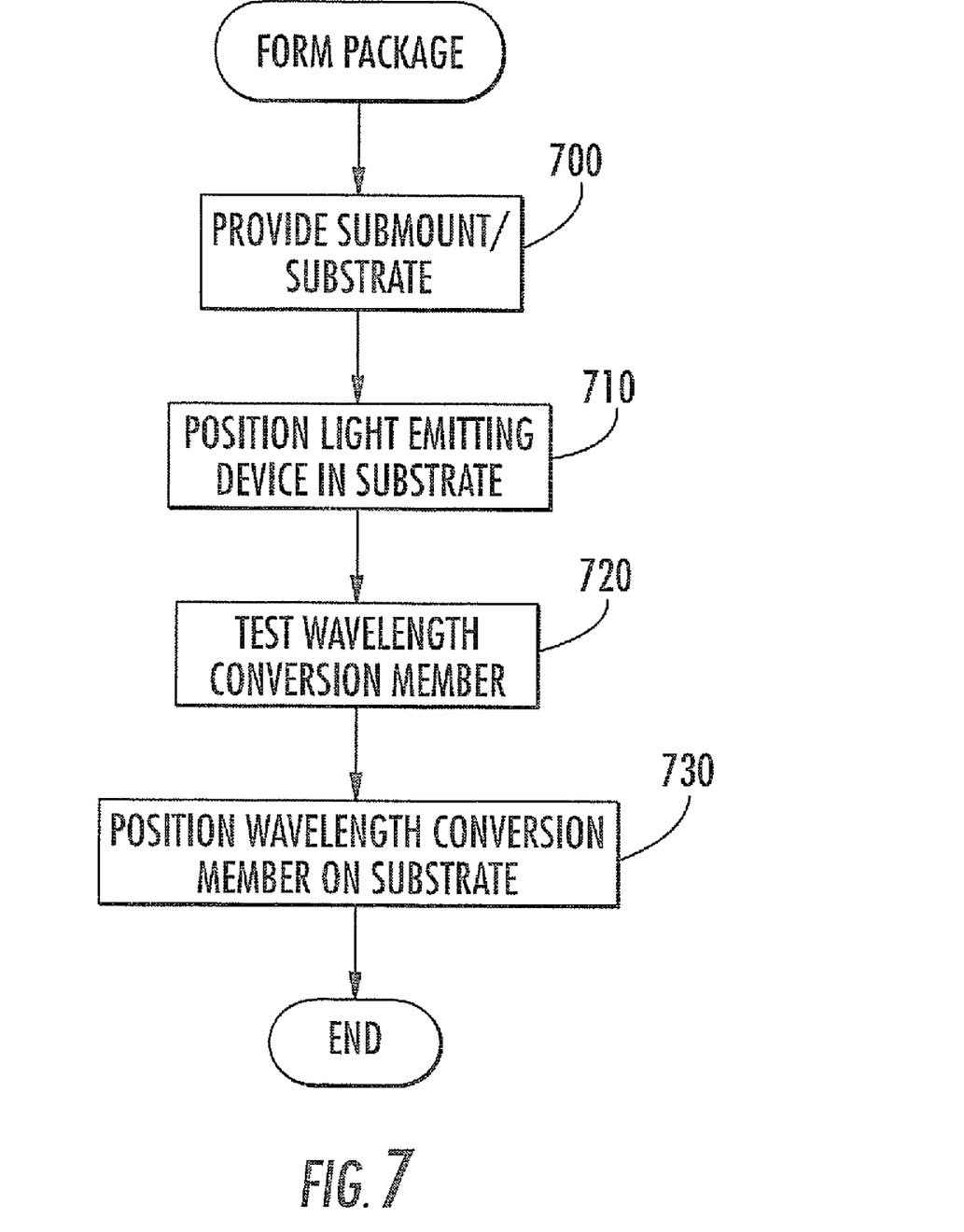
FIG. 7 is a flowchart illustrating operations for forming a semiconductor light emitting device according to some embodiments of the present invention.

Methods of forming a light emitting device package according to some embodiments of the present invention will now be described with reference to the flow chart illustration of FIG. 7. As shown in FIG. 7, operations begin at Block 700 by providing a submount. For example, the submount may be a semiconductor substrate formed as described, for example, with reference to FIG. 6 above. A light emitting device is positioned in a cavity of the submount/substrate (Block 710). A first node of the light emitting device may be positioned in contact with the first bond pad formed in the cavity and the second node of the light emitting device may be placed in contact with a second bond pad formed in a cavity of the substrate.

In particular embodiments of methods according to the present invention, a solid wavelength conversion member is pre-tested to determine a wavelength conversion characteristic thereof (Block 720). Such testing may provide for a higher yield of the formed light emitting device package by testing the wavelength characteristics of the wavelength conversion member before attachment of the same to the light emitting device package. After testing, the solid wavelength conversion member is positioned on the substrate over the light emitting device to receive and wavelength convert light emitted from the light emitting device (Block 730). The wavelength conversion member, as illustrated in FIGS. 3A and 3B, may have either a flat and/or concave shape on an upper surface of the wavelength conversion member opposite the light emitting device mounted in the cavity.

The flowcharts of FIGS. 6 and 7 and the schematic illustrations of FIGS. 2 through 5 illustrate the functionality and operation of possible implementations of methods for forming a submount and/or a light emitting device package according to some embodiments of the present invention. It should be noted that, in some alternative implementations, the acts noted in describing the figures may occur out of the order noted in the figures. For example, two blocks/operations shown in succession may, in fact, be executed substantially concurrently, or may be executed in the reverse order, depending upon the functionality involved.

As noted above, mounting of an LED chip in a recessed cavity of a semiconductor substrate chip carrier/submount may provide a white emitting chip with a small optical image size, not substantially larger than the LED chip itself. The recessed cavity may act as an optical cavity and light concentrator. The mounted LED chip may also provide the means to place a pre-manufactured or in-situ formed white converter element in close proximity over the LED chip. This placement may provide for an image size of the white emitter that is substantially the same as that of the LED chip. Depending on the desired functionality, the submount may be integrated into conventional electronic packages. The submount may also be encapsulated itself, which may improve its mechanical stability, to provide a stand alone chip-scale package.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A method of packaging a semiconductor light emitting device, comprising:
    disposing the light emitting device on a submount; and
    positioning a solid wavelength conversion member on the submount over the light emitting device and displaced therefrom to receive and wavelength convert light emitted from the light emitting device, wherein the wavelength conversion member comprises a lens having a predetermined optical transmission pattern and wherein the light emitting device has an optical emission pattern associated with a chip shape of the light emitting device and the positioned solid wavelength conversion member provides the packaged semiconductor light emitting device a selected optical pattern based on the optical transmission pattern and the optical emission pattern.

2. The method of claim 1 wherein the solid wavelength conversion member comprises a rigid wavelength conversion member of glass, silicon and/or cured epoxy having wavelength conversion material therein.

3. The method of claim 2 wherein the wavelength conversion material comprises phosphor.

4. The method of claim 2 wherein the light emitting device comprises a light emitting diode (LED).

5. The method of claim 2 wherein the wavelength conversion member is flat and/or convex on a surface thereof opposite the light emitting device.

6. The method of claim 5 wherein the wavelength conversion member is convex on a surface thereof opposite the light emitting device.

7. The method of claim 5 wherein the optical pattern comprises a far-field optical pattern.

8. The method of claim 5 wherein the optical pattern comprises a near-field optical pattern.

9. The method of claim 2 wherein the submount comprises a semiconductor substrate.

10. The method of claim 2 wherein positioning a rigid wavelength conversion member on the submount is preceded by testing the rigid wavelength conversion member to determine a wavelength conversion characteristic thereof.

11. A method, comprising:
    providing a semiconductor substrate comprising a mounting location configured to receive a light emitting device;
    providing a first conductive path extending from the mounting location to an external surface of the substrate;
    providing a second conductive path extending from the mounting location to an external surface of the substrate, wherein the first conductive path and the second conductive path include doped regions;
    providing a first bond pad on the mounting location on an end of the first conductive path extending therefrom;
    providing a second bond pad on the mounting location on an end of the second conductive path extending therefrom.

12. The method of claim 11 further comprising providing integral opposing zener diode junctions coupling the first and second conductive paths to provide electro-static discharge (ESD) protection to a light emitting device positioned on the mounting location.

13. The method of claim 12 wherein the semiconductor substrate includes a first conductivity type doped region of semiconductor material and wherein providing integral opposing zener diode junctions includes providing an opposite conductivity type doped region of semiconductor material in the first conductivity type doped region as the doped region of the first conductive path and providing a second opposite conductivity type doped region of semiconductor material in the first conductivity type doped region as the doped region of the second conductive path.

14. A method of forming a light emitting device package including the method of claim 13 and further comprising:
    positioning the light emitting device on the mounting location with a first node of the light emitting device coupled to the first bond pad and a second node of the light emitting device coupled to the second bond pad; and
    positioning a solid wavelength conversion member over the light emitting device to receive and wavelength convert light emitted from the light emitting device.

15. The method of claim 14 wherein positioning a solid wavelength conversion member on the submount is preceded by testing the solid wavelength conversion member to determine a wavelength conversion characteristic thereof.

16. The method of claim 15, wherein testing the solid wavelength conversion member includes matching the wavelength conversion member to a particular light emitting device output and wherein positioning the solid wavelength conversion member comprises selecting the solid wavelength member to be positioned over the light emitting device based on the match of the wavelength conversion member to a particular light emitting device output, the particular light emitting device output being associated with the underlying light emitting device.

17. The method of claim 15 wherein the wavelength conversion member is flat and/or concave on a surface thereof opposite the light emitting device.

18. The method of claim 11, wherein the mounting location comprises a cavity provided in the semiconductor substrate that is configured to receive a light emitting device, the cavity having a floor and a sidewall angled with respect to the floor at an angle of at least about 90°.

19. A method, comprising:
providing a plurality of light emitting devices, each of which has an associated predetermined light emitting device output;
providing a plurality of wavelength conversion members, each of which has an associated predetermined wavelength conversion characteristics; and
matching one of the light emitting devices with one of the wavelength conversion members based on their respective associated light emitting device output and wavelength conversion characteristic;
wherein matching includes selecting the matched ones of the wavelength conversion members to have wavelength conversion characteristics that differ based on differences in the associated light emitting device output of their respective ones of the light emitting devices and wherein the wavelength conversion characteristic comprises an optical transmission pattern and wherein the associated light emitting device output comprises an optical emission pattern associated with an associated chip shape of the light emitting devices.

20. The method of claim 19, wherein matching is followed by assembling a light emitting device package with the one of the wavelength conversion members positioned over the matching one of the light emitting devices to provide a desired output of the light emitting device package.

21. The method of claim 20, wherein the wavelength conversion members comprise rigid wavelength conversion members of glass, silicon and/or cured epoxy having wavelength conversion material therein and wherein assembling the light emitting device package includes positioning the wavelength conversion member displaced from the corresponding one of the light emitting devices.

22. The method of claim 19, wherein the light emitting device output comprises a frequency.

23. The method of claim 19, wherein the wavelength conversion characteristic comprises a color point.

24. The method of claim 19, wherein providing the plurality of wavelength conversion members is preceded by testing the plurality of wavelength conversion members to determine their associated wavelength conversion characteristics.

* * * * *